(12) United States Patent
Senatori

(10) Patent No.: US 9,054,444 B2
(45) Date of Patent: Jun. 9, 2015

(54) CONNECTOR DOOR FOR AN ELECTRONIC DEVICE

(75) Inventor: Mark D. Senatori, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 14 days.

(21) Appl. No.: 14/125,069

(22) PCT Filed: Jun. 27, 2011

(86) PCT No.: PCT/US2011/042041
§ 371 (c)(1),
(2), (4) Date: Dec. 9, 2013

(87) PCT Pub. No.: WO2013/002761
PCT Pub. Date: Jan. 3, 2013

(65) Prior Publication Data
US 2014/0113467 A1    Apr. 24, 2014

(51) Int. Cl.
*H01R 13/44* (2006.01)
*H01R 13/447* (2006.01)
*H01R 13/52* (2006.01)
*G06F 1/16* (2006.01)
*H05K 5/03* (2006.01)

(52) U.S. Cl.
CPC .......... *H01R 13/5202* (2013.01); *G06F 1/1633* (2013.01); *G06F 1/1656* (2013.01); *H01R 13/447* (2013.01); *H05K 5/03* (2013.01)

(58) Field of Classification Search
CPC .. H01R 13/447; H01R 13/5213; H01R 13/44; H01R 13/639
See application file for complete search history.

(56) References Cited

U.S. PATENT DOCUMENTS

| | | | |
|---|---|---|---|
| 5,199,888 A * | 4/1993 | Condra et al. | 439/142 |
| 5,752,857 A | 5/1998 | Knights | |
| 6,002,581 A | 12/1999 | Lindsey | |
| 6,093,038 A | 7/2000 | Chen et al. | |
| 6,176,721 B1 * | 1/2001 | Gottardo et al. | 439/260 |
| 6,373,689 B1 * | 4/2002 | Yim | 361/679.29 |
| 6,757,160 B2 | 6/2004 | Moore et al. | |
| 6,979,775 B2 * | 12/2005 | Ritter et al. | 174/40 R |
| 7,476,112 B2 * | 1/2009 | O'Connell et al. | 439/133 |
| 7,763,799 B2 * | 7/2010 | Johnson | 174/67 |
| 7,850,371 B2 | 12/2010 | Riley et al. | |

(Continued)

FOREIGN PATENT DOCUMENTS

| | | |
|---|---|---|
| EP | 585646 | 3/1996 |
| WO | WO-2010044057 | 4/2010 |

OTHER PUBLICATIONS

International Searching Authority, International Search Report and Written Opinion, Application No. PCT/US2011/042041, Date of Mailing Dec. 27, 2011, 8 p.

*Primary Examiner* — Gary Paumen
(74) *Attorney, Agent, or Firm* — Hewlett-Packard Patent Department

(57) ABSTRACT

An electronic device includes a housing, a system connector accessible at an external surface of the housing, and a hinged door to selectively expose or cover the system connector. The electronic device may also include a mechanism coupled to the hinged door that pivotally biases the door from an open position, in which the system connector can receive an external connector, to a partially closed position in which the hinged door at least partially covers said system connector. The hinged door is to slide along the housing if the hinged door is moved from the partially closed position to a fully closed position.

15 Claims, 12 Drawing Sheets

(56) References Cited

U.S. PATENT DOCUMENTS

| | | | |
|---|---|---|---|
| 2002/0055291 A1* | 5/2002 | Maiterth et al. | 439/326 |
| 2007/0243732 A1* | 10/2007 | Gu et al. | 439/131 |
| 2009/0266574 A1* | 10/2009 | Atkinson et al. | 174/67 |
| 2013/0017696 A1* | 1/2013 | Alvarez Rivera | 439/142 |

* cited by examiner

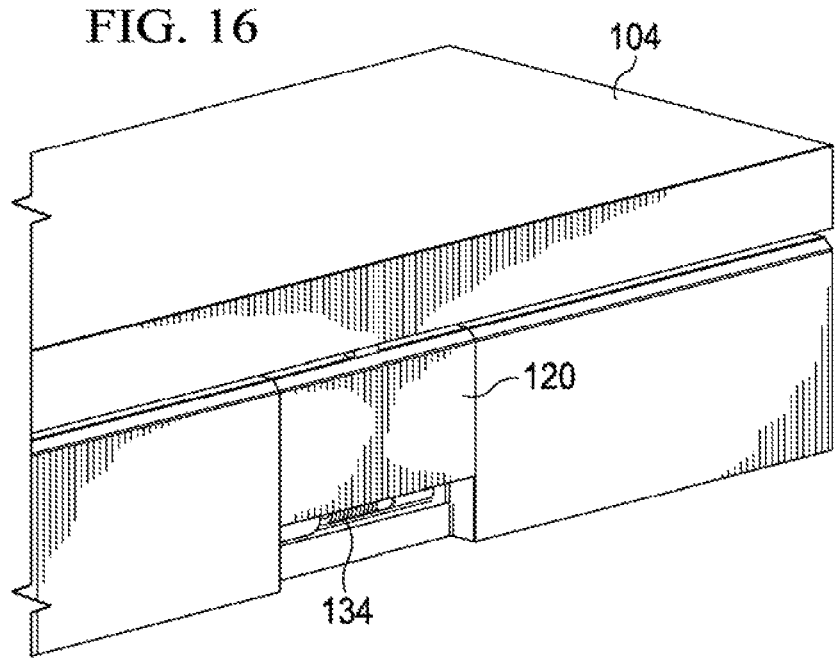

CONNECTOR DOOR FOR AN ELECTRONIC DEVICE

BACKGROUND

Some users of electronic devices, such as notebook computers and the like, may use their devices in harsh environments (e.g., dusty, wet, etc.). Such conditions may be detrimental to the operation of the electronic device. For example, dust and/or water entering an electronic device may short out circuits in the electronic device thereby damaging the device.

BRIEF DESCRIPTION OF THE DRAWINGS

For a detailed description of exemplary implementations, reference will now be made to the accompanying drawings in which:

FIGS. 10-16 show the operation of the hinged door upon removal of an external connector in accordance with various examples.

DETAILED DESCRIPTION

Various embodiments, such as those described herein, are directed to a ruggedized electronic device. In particular, the electronic device has one or more externally available connectors for a user to connect, for example, an external cable (e.g., an Ethernet cable, a universal serial bus (USB) cable), an external device (e.g., a USB Flash memory device), or receive an electronic card (e.g., a memory card). When not needed, each connector is protected by a hinged door. A seal is also provided around the connector that protects the connector from contaminants such as water, dust, dirt, etc. The seal is automatically engaged by the action of closing and locking the hinged door. The hinged door further includes or is coupled to a biasing member, such as a spring, that biases the door toward its closed position. As such, upon removal of the external cable or external device from the connector, the hinged door automatically hinges toward its closed position by action of the biasing member.

Figure 1:
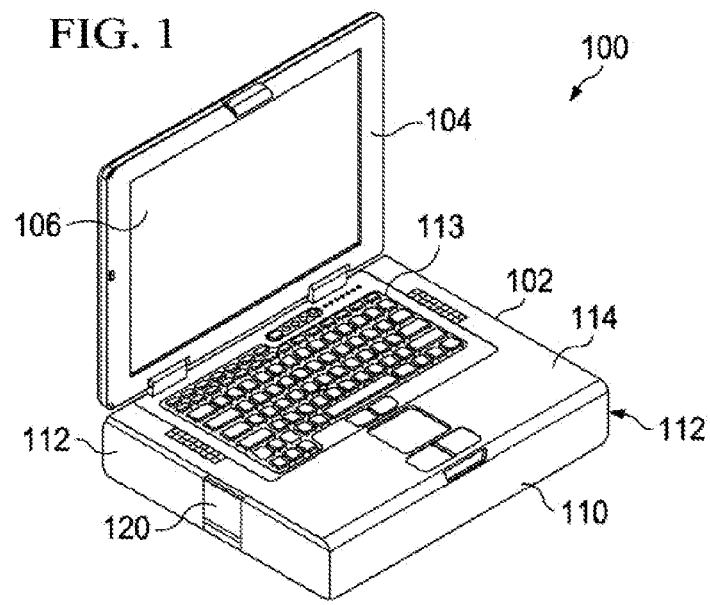
FIG. 1 illustrates an electronic device with a hinged connector door in accordance with various examples.

FIG. 1 illustrates an electronic device 100 in accordance with various embodiments. As shown, electronic device 100 comprises a base 102 to which a display lid 104 (containing a display 106) is coupled by way of a hinge. The electronic device 100 may be representative of a notebook computer, but the electronic device 100 need not have a hinged lid and can be other than a notebook computer. Electronic device 100, for example, may comprise a tablet computer. In general, electronic device 100 comprises one or more connectors that are externally available for connection by a user of a cable or external device. At least one, and possibly every, connector is protected by a hinged door. Each connector provided on the electronic device is also referred to herein as a "system connector" simply to avoid confusion when referring to an external connector to which the system connector mates.

FIG. 1 shows a hinged door 120 in a closed position. A system connector is provided on the base 102 but is concealed by door 120 and thus not shown in the view of FIG. 1. The base 102 comprises a front surface 110, side surfaces 112, and a top surface 114. A keyboard 113, or other type of user input device, is accessible on the top surface 114 of base 102.

FIG. 1 shows a single hinged door, but in general in number of hinged doors and system connectors can be provided as desired. Each system connector is protected by its own hinged door, but in some embodiments, a hinged door can be large enough so as to cover and protect more than one system connector.

Figure 2:
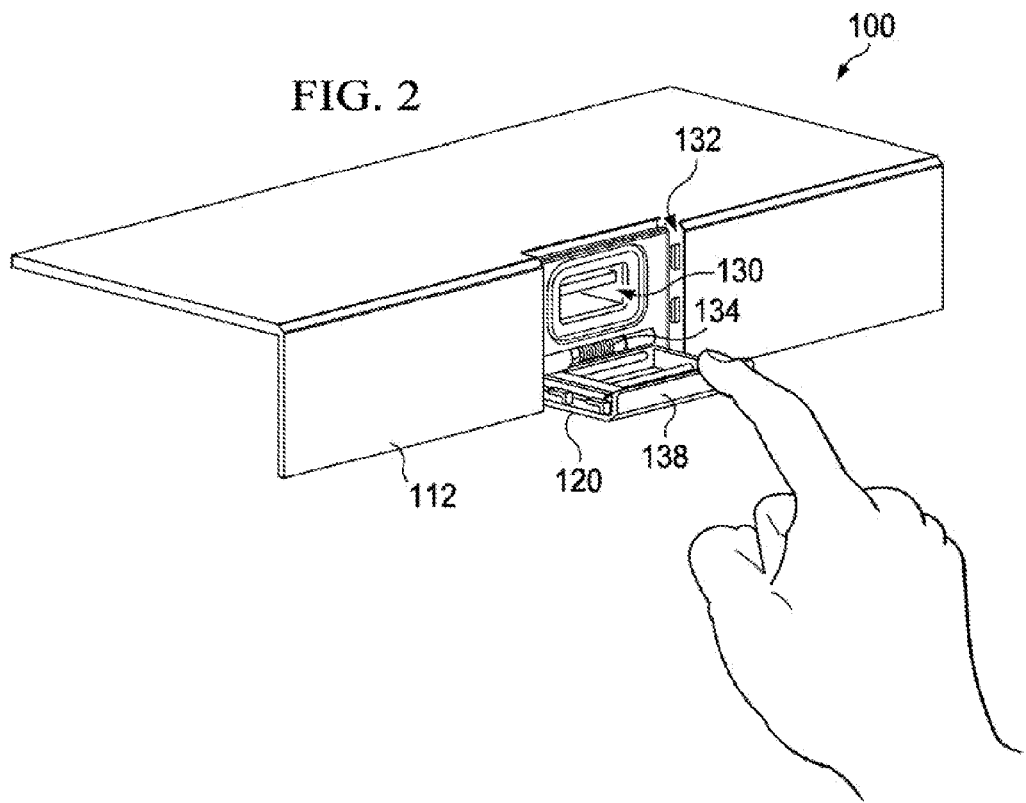
FIG. 2 illustrates the hinged door in an open position in accordance with various examples.

FIG. 2 shows a view of the hinged door 120 in an open position by way of a person puffing the door down as shown. With the door 120 open, a system connector 130 is exposed and can receive an external mating connector from a cable (shown in other figures) or an external device. As shown, the hinged door 120 comprises a top angled lip 138. The connector 130 is provided in an opening defined by a recessed area 132 in the side 112 of the electronic device. When closed, the hinged door 120 generally occupies the recessed area 132 in the surface 112 of the electronic device which permits the hinged door to generally fit flush with regard to surface 112.

FIG. 2 also shows a biasing member 134 which couples to the hinged door. In some embodiments, the biasing member 134 comprises a torsion spring although other types of biasing members are possible as well. The biasing member 134 pivotally biases the hinged door 120 from the open position, in which the system connector 130 can receive an external connector, to a partially closed position in which the hinged door at least partially covers the system connector 130. The process of closing the hinged door 120 will be explained below.

Figure 3:
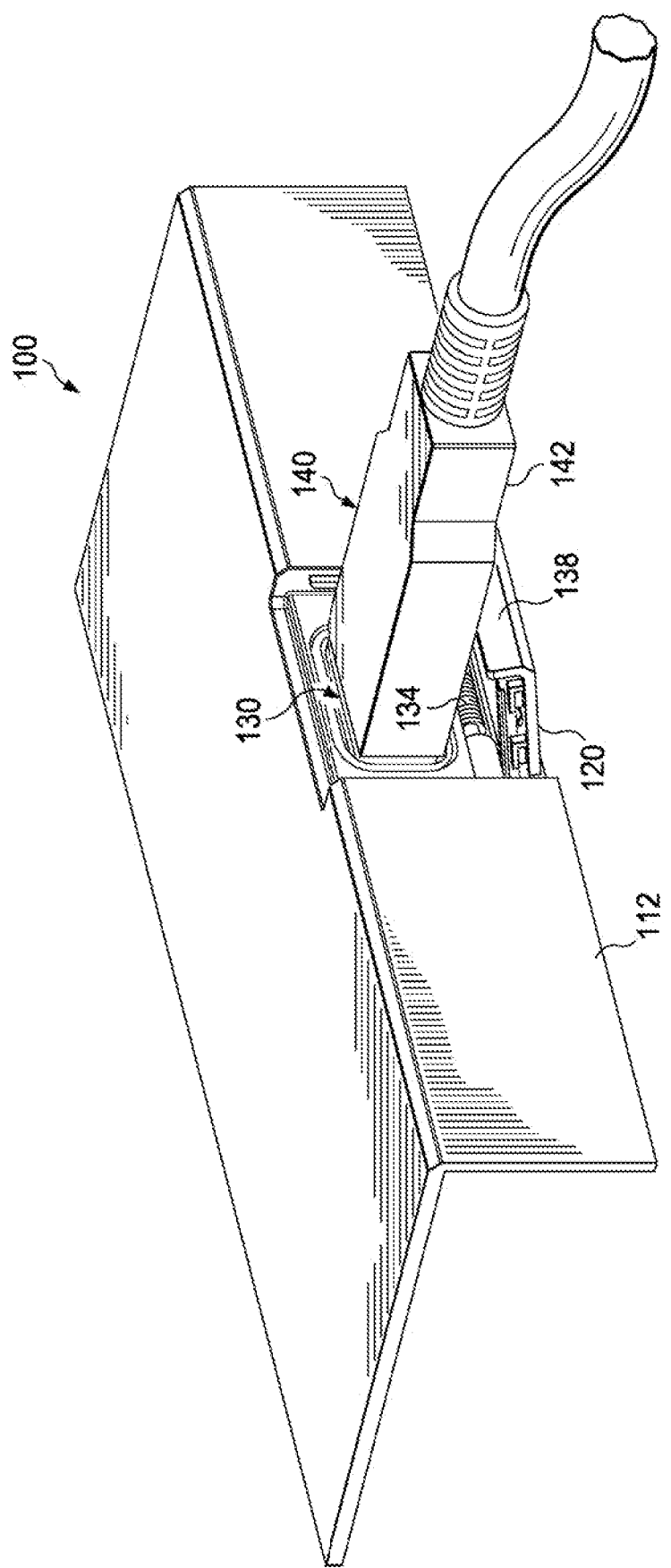
FIG. 3 shows a cut-away view of an external connector mated to a system connector with the hinged door in the open position in accordance with various examples.

FIG. 3 illustrates the hinged door 120 in the open position and an external connector 140 connected to the system connector 130. While the biasing member 134 tends to force the hinged door 120 towards the closed position, the hinged door contacts the bottom side 142 of the external connector 140 thereby preventing the door from actually closing.

Figure 4:
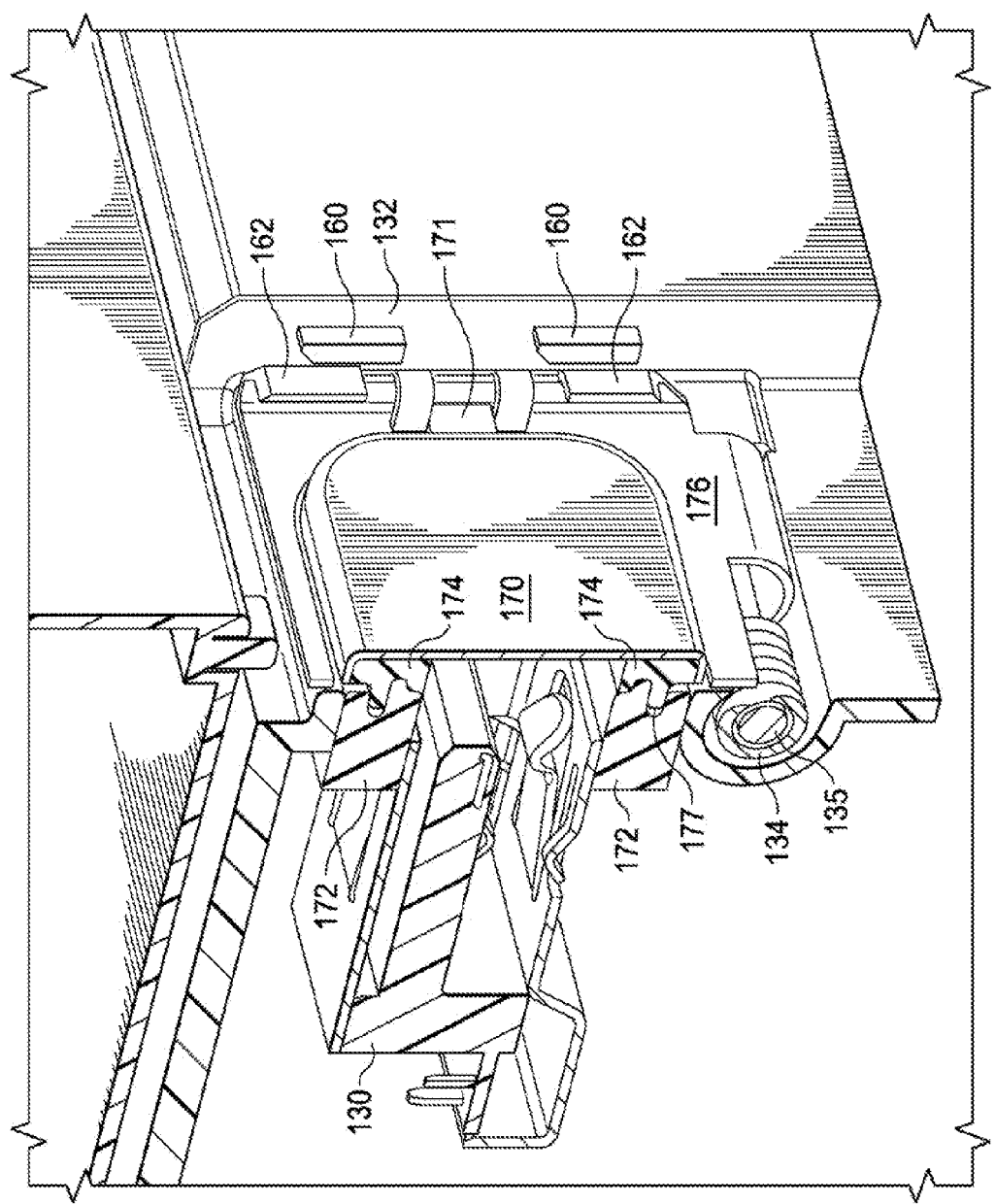
FIG. 4 illustrates a cut-away view of the system connector area without the hinged door in place in accordance with various examples.

FIG. 4 shows a cut-away view of the system connector area without the hinged door. A seal is comprised of two gaskets 172 and 174 provided around the system connector 130. Connector gasket 172 is made from any suitable material such as silicone rubber and provides a groove as shown for receiving a tongue 177 from a door mating gasket 174 which also may be made of silicone rubber. The gaskets 172, 174 form a compression seal when fully engaged, which occurs when the hinged door 120 is in its fully closed position as discussed below. Door mating gasket 174 is provided on an interior surface of a door mating gasket floating carrier 170. The door mating gasket floating carrier 170 is forced inward, that is toward the system connector 130, by action of the hinged door 120 (not shown in FIG. 4) being forced downward in a vertical direction by a user's hand or the display lid 104 of the electronic device 100.

The biasing member 134 is wrapped around a generally cylindrical member 135 in the embodiment of FIG. 4. FIG. 4 also shows an inner door frame 176 to which the biasing member 134 couples. The biasing member 134 pivotally biases the inner door frame 176 toward the system connector 130. By forcing the inner door frame 176 outward, and thus opposing the force created by the biasing member 134, the door mating gasket floating carrier 170 is also forced outward thereby disengaging the two gaskets 172, 174 of the compression seal.

FIG. 4 further shows a plurality of system catches 160 on one side of the recessed area 132. Two system catches 160 are shown but in general any number (one or more) can be provided. In some embodiments, both sides of the recessed area 132 on opposite sides of the hinged door 120 have one or more system catches 160.

Figure 5A:
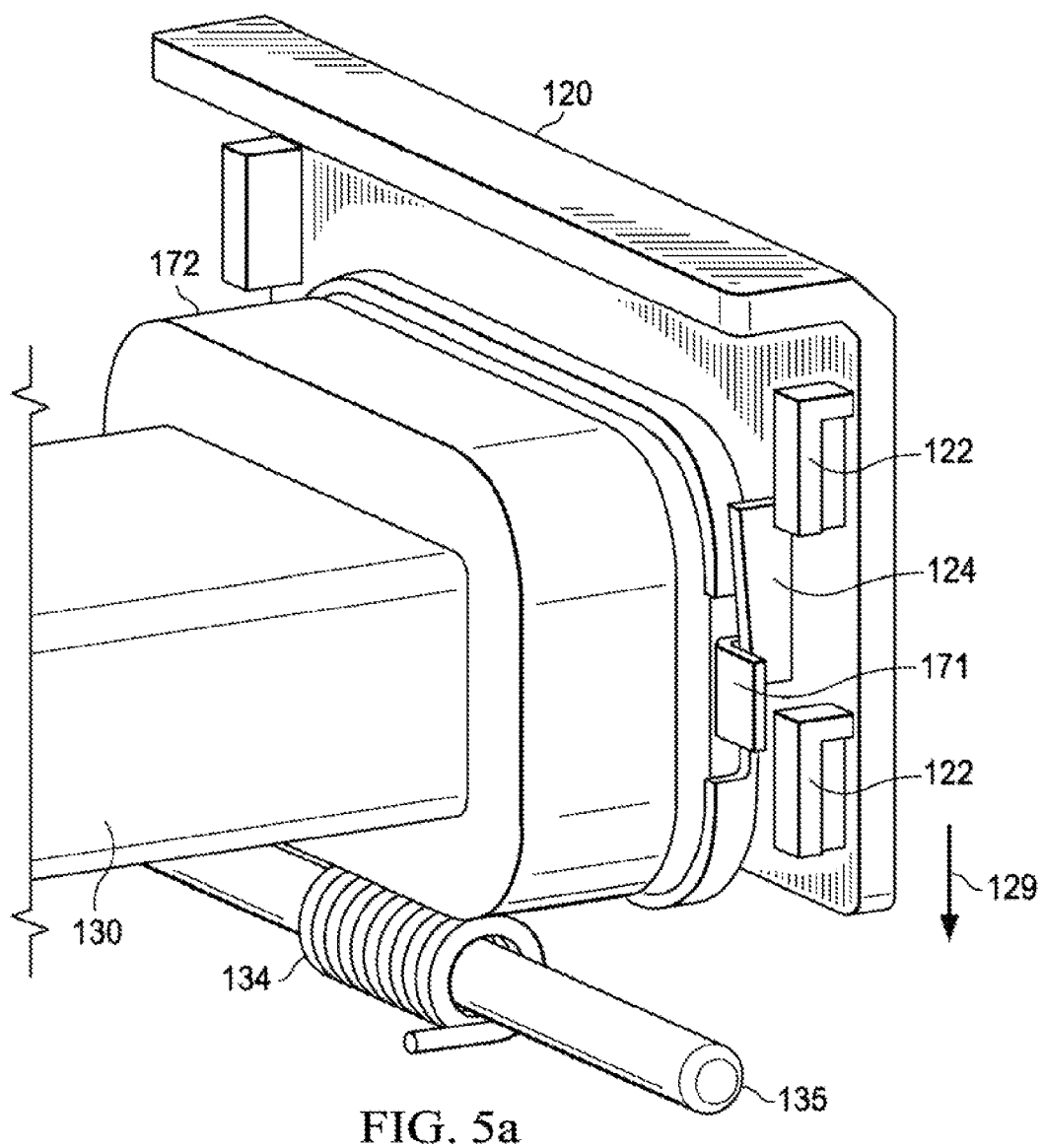
FIG. 5a shows a cut-away view of the back side of the hinged door with the hinged door in a partially closed position in accordance with various examples.
Figure 5B:
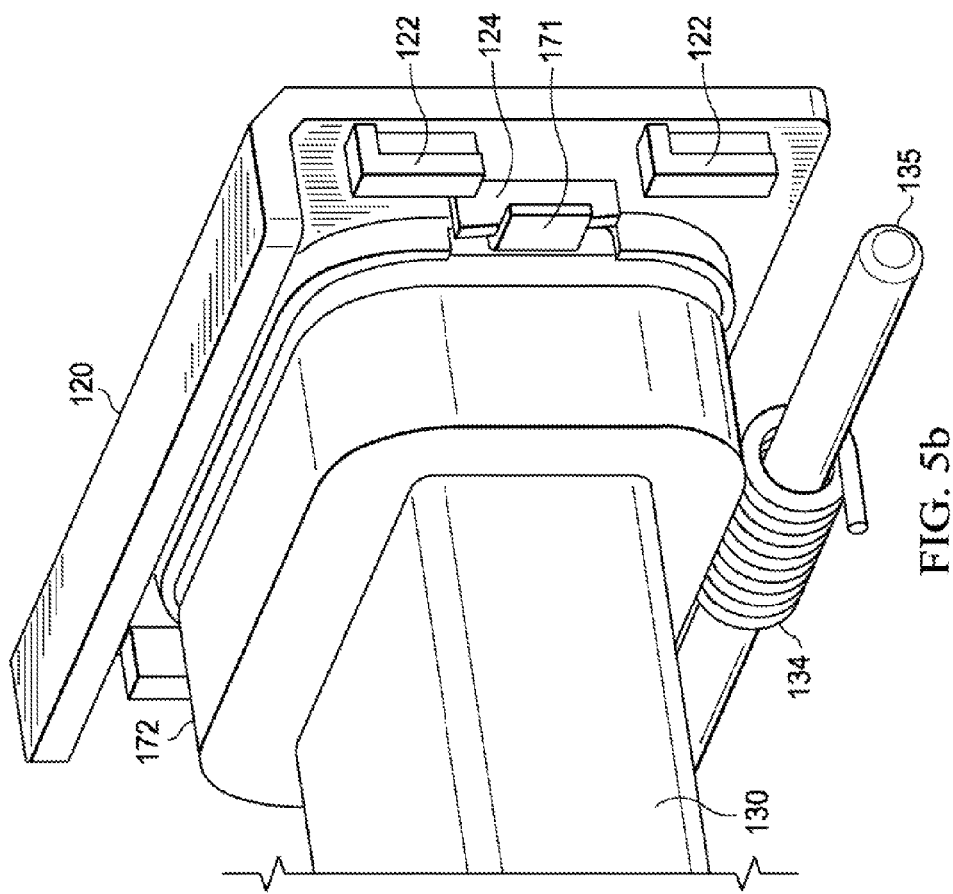
FIG. 5b shows a cut-away view of the back side of the hinged door with the hinged door in a fully closed position in accordance with various examples.

FIGS. 5*a* and 5*b* illustrate a back side view of the hinged door 120. The hinged door 120 comprises one or more door catches 122 and at least one door ramp 124. In the embodiment of FIGS. 5*a* and 5*b*, each side of the hinged door 120 comprises two door catches 122 and one door ramp 124. The door catches 122 catch behind the system catches 160 (i.e., on the system connector 130 side of system catch 160) to retain the hinged door 120 in place. As the door 120 is slid downward in the direction of arrow 129 (FIG. 5*a*), the door catches 122 slide along and behind the system catches 160.

FIG. 4 also shows alignment ribs 162 which are provided on opposing sides of the inner door frame 176. The alignment ribs 162, which are part of the inner door frame 176, are used to keep door mating gasket floating carrier 170 aligned with the connector opening, allowing the receiving tongue 177 and door mating gasket 174 to be in alignment before a seal is made.

Figure 6:
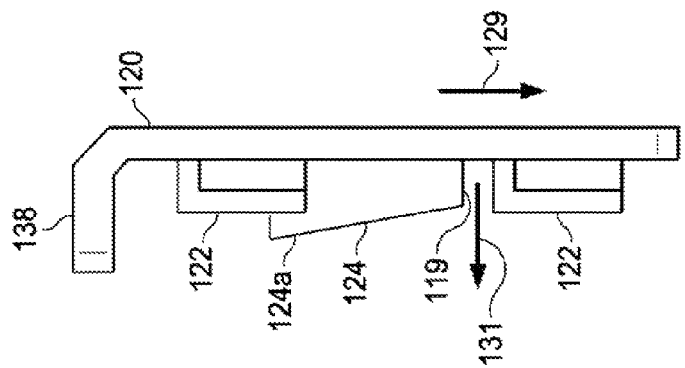
FIG. 6 shows a side view of the hinged door in accordance with various examples.

Referring again to the embodiment of FIG. 5*a*, the door ramp 124 is angled. FIG. 6 shows a side view of the hinged door 120 depicting the angled geometry of the angled door ramp 124. The door catches 122 are also shown in FIG. 6. Surface 124*a* of door ramp 124 is angled as shown and generally is thicker towards angled lip 138 and tapers towards the opposing end 119.

Referring back to FIG. 4, a tab 171 is shown extending laterally from door mating gasket floating carrier 170. In some embodiments, each side of the door mating gasket floating carrier 170 has at least one such tab 171. The hinged door's angled door ramps 124 contact the tabs 171 as the door is forced downward along direction of arrow 129 (FIG. 5*a*). The angled surface 124*a* of the angled ramp 124 (FIG. 5*b*) causes a lateral force on tabs 171 along the direction of arrow 131 as the door is forced downward in the direction of arrow 129. These lateral forces (inward towards system connector 130) forces the door mating gasket floating carrier 170 inward thereby fully engaging the compression seal gaskets 172, 174.

FIG. 5*a* shows the hinged door 120 in a partially closed position meaning that the door at least partially covers the system connector 130 and begins to engage the seal's gaskets 172 and 174. FIG. 5*b* shows the hinged door 120 in its fully closed position after being slid downward as discussed above. Lateral pressure on tabs 171 from angled door ramps 124 cause the compression seal 172, 174 to be fully engaged. At that point, the system connector 130 is sealed and protected from contaminants such as water, dirt, and dust. In some embodiments, gaskets 172 and 174 form a hermetic seal.

Figure 7:
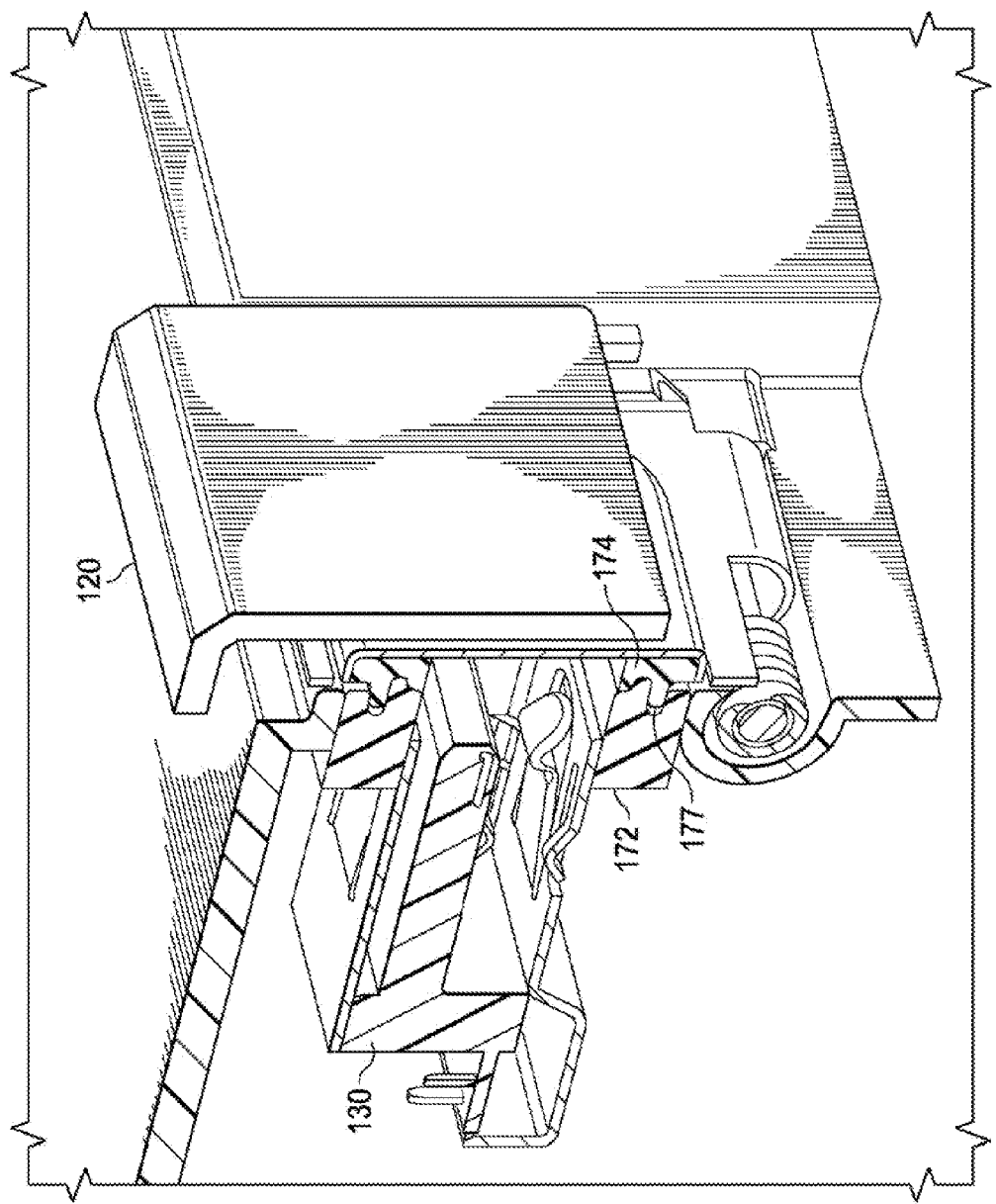
FIGS. 7 and 8 show the hinged door in the partially closed and fully closed positions, respectively, in accordance with various examples.
Figure 8:
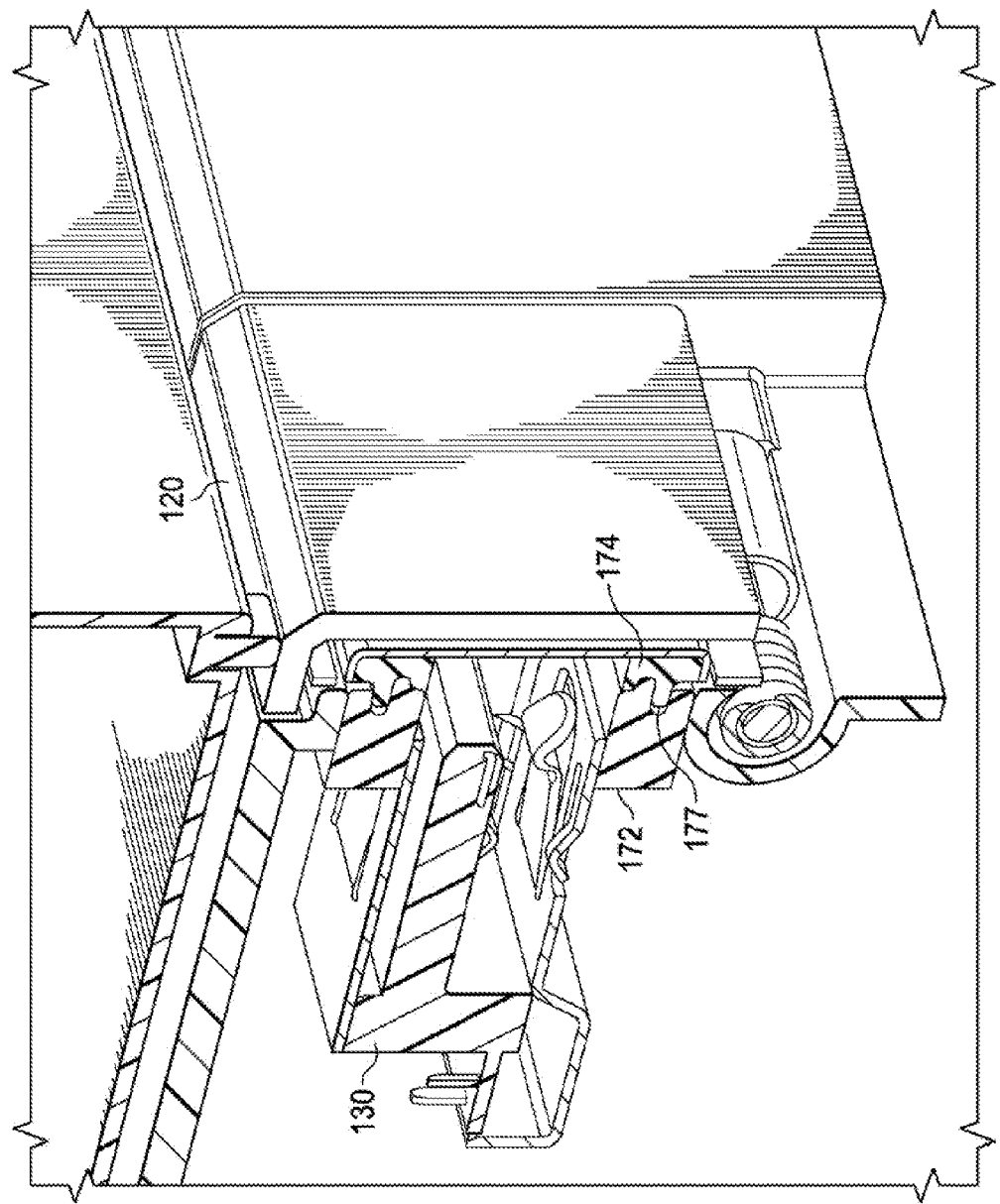

FIGS. 7 and 8 also illustrate the hinged door 120 in the partially closed position (FIG. 7) and in the fully closed position (FIG. 8). In the partially closed position of FIG. 7, the compression seal (gaskets 172 and 174) begins to engage and is fully engaged when the door 120 reaches its fully closed position (FIG. 8).

Figure 9:
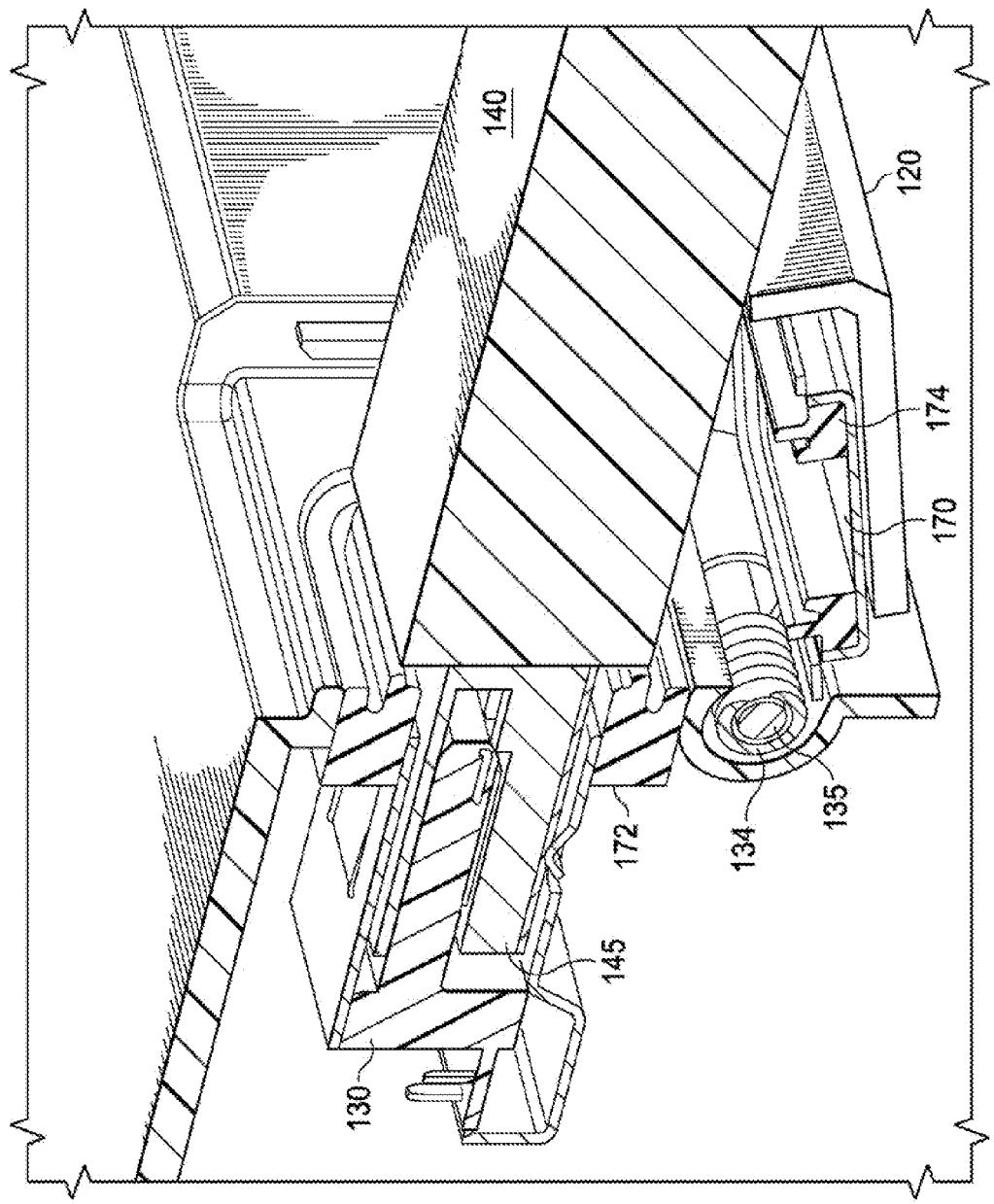
FIG. 9 shows a cut-away view of the hinged door in the open position in accordance with various examples.

FIG. 9 shows a cut-away view of the hinged door in the open position with an external connector 140 mated to the system connector 130. The door mating gasket 174, which is provided on the back side of the door mating gasket floating carrier 170, is shown separated from connector gasket 172.

Figure 10:
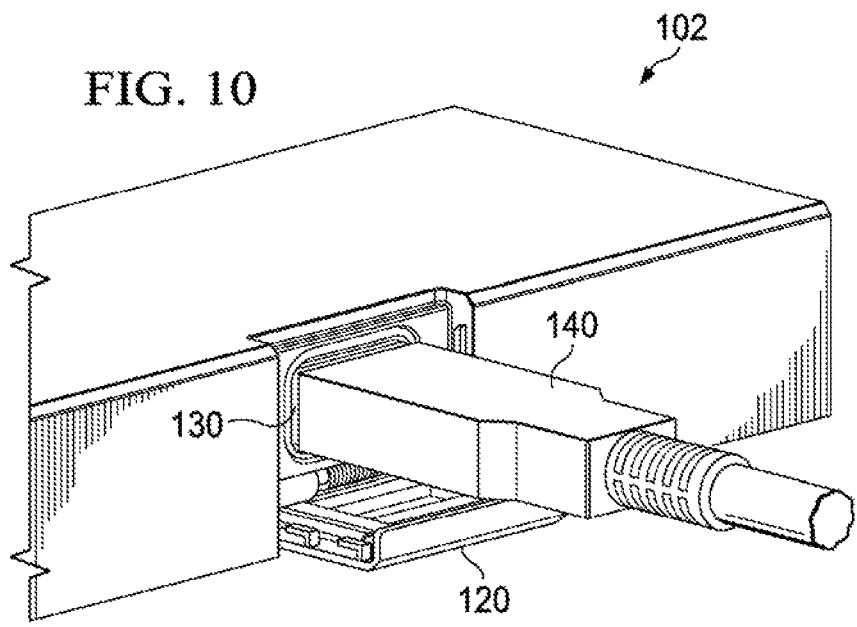
Figure 11:
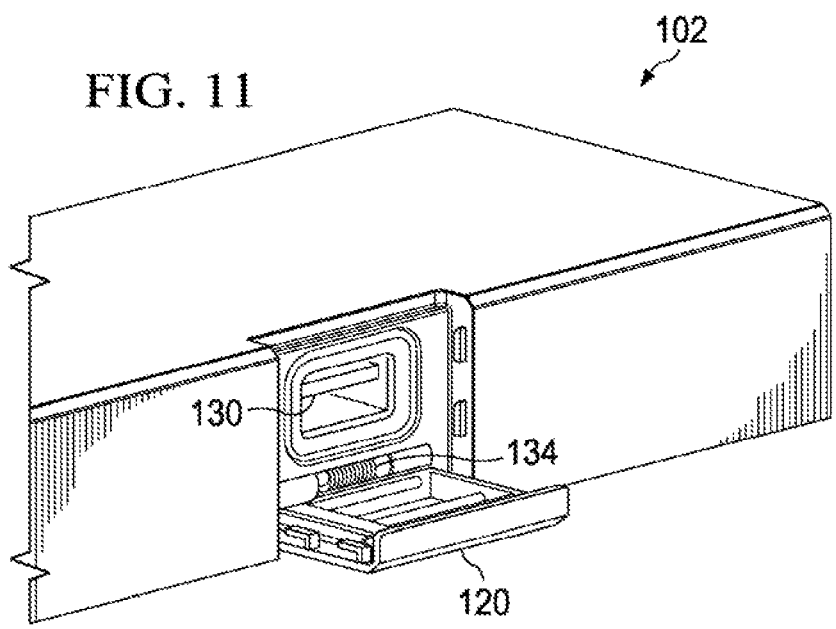
Figure 12:
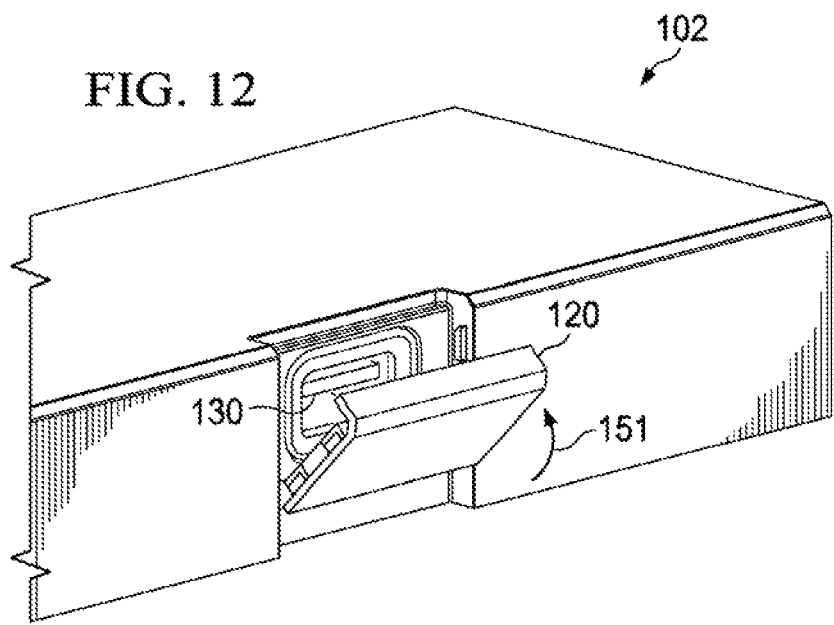

FIGS. 10-16 illustrate the sequence of events in removing the external connector and closing the hinged door 120. FIG. 10 shows the hinged door 120 in the open position with an external connector 140 mated to the system connector 130. In FIG. 11, a user has removed the external connector 140 which then permits the biasing member 134 to begin to pivotally bias the door 120 from the open position toward the partially closed position as indicated by arrow 151 in FIG. 12.

Figure 13:
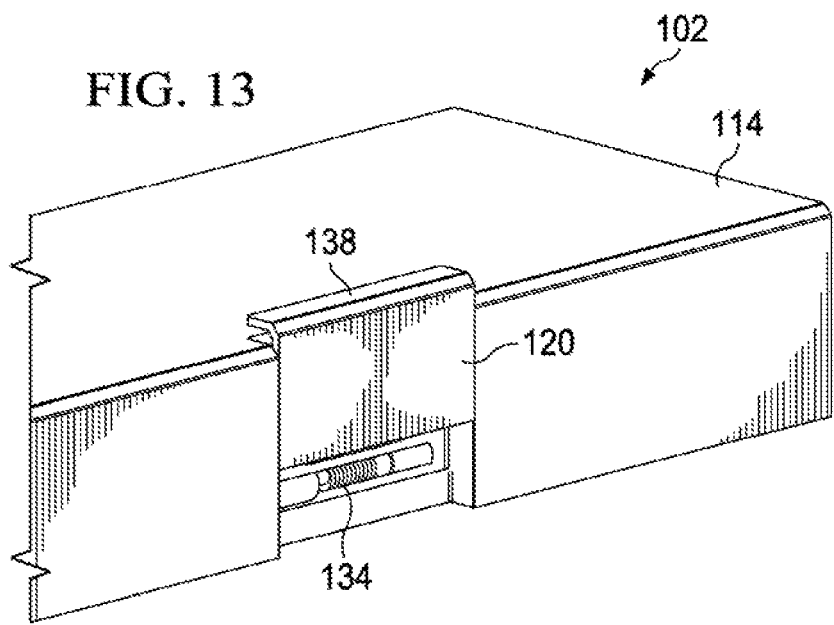
Figure 14:
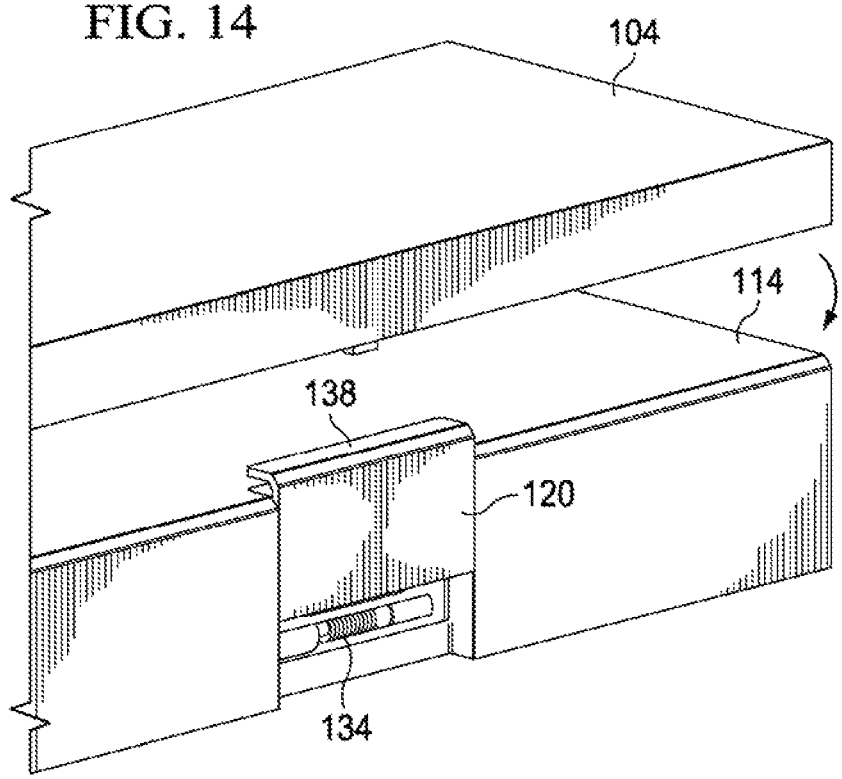
Figure 15:
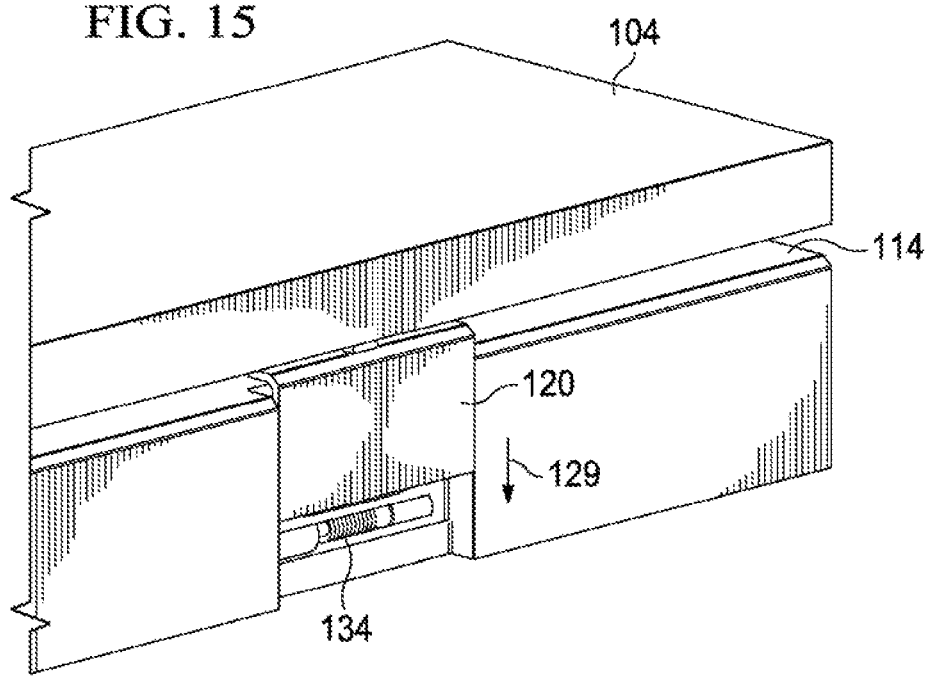

FIG. 13 illustrates the hinged door 120 in the partially closed position. The door 120 extends upward by a small amount over the top surface 114 of the base 102. FIG. 14 shows the display lid 104 beginning to be closed by a user. Once the display lid 104 contacts the top angled lip 138 of the hinged door 120, further downward pressure on the display lid 104 forces the hinged door 120 downward in a vertical direction as indicated by arrow 129 in FIG. 15. Once the display lid 104 is fully closed, the hinged door 120 will have reached its fully closed position as shown in FIG. 16 thereby fully sealing and protecting the system connector 134.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic device, comprising:
   a housing;
   a system connector accessible at an external surface of said housing;
   a hinged door to selectively expose or cover said system connector; and
   a mechanism coupled to said hinged door that pivotally biases said door from an open position, in which said system connector can receive an external connector, to a partially closed position in which said hinged door at least partially covers said system connector;
   wherein said hinged door is to slide along the housing if said hinged door is moved from said partially closed position to a fully closed position.

2. The electronic device of claim 1 wherein the mechanism comprises a spring.

3. The electronic device of claim 1 further comprising a first seal member surrounding said electrical connector.

4. The electronic device of claim 3 further comprising a second seal member to engage said first seal member upon said hinged door biased to the partially closed position.

5. The electronic device of claim 1 further comprising a compression seal surrounding said electrical connector and covered by said hinged door when biased to the partially closed position.

6. The electronic device of claim 1 wherein said hinged door comprises an angled ramp to engage a tab upon said hinged door forced into the fully closed position, wherein engagement of the tab by said angled ramp engages a compression seal.

7. The electronic device of claim 1 wherein the housing comprises a system catch and said hinged door comprises a door catch to slide along the system catch as the hinged door is forced from the partially closed position to the fully closed position.

8. The electronic device of claim 1 wherein said hinged door comprises a plurality of angled ramps and a plurality of door catches and the electronic device further includes a compression seal, and wherein upon removing said external connector, said hinged door pivotally biases to the partially closed position thereby beginning to engage said compression seal.

9. The electronic device of claim 1 further comprising a hinged lid and wherein closure of the hinged lid causes said lid to force the hinged door from the partially closed position to the fully closed position thereby to completely engage a compression seal.

10. An electronic device, comprising:
   a housing;
   a system connector accessible at an external surface of said housing;
   a hinged door to selectively expose or cover said system connector, said hinged door comprising an angled ramp;
   a seal surrounding said system connector; and
   a mechanism coupled to said hinged door that pivotally biases said door toward a partially closed position that at least partially covers said system connector;
   wherein said seal is engaged by pressure of said angled ramp upon the hinged door sliding from the partially closed position to a fully closed position.

11. The electronic device of claim 10 wherein housing comprises a system catch and said hinged door comprises a door catch that slides along the system catch as said hinged door slides from the partially closed position to the fully closed position.

12. The electronic device of claim 10 further comprising a seal floating carrier coupled to said seal and wherein said seal is engaged by pressure of said angled ramp on said seal floating carrier upon the hinged door sliding from the partially closed position to the fully closed position.

13. The electronic device of claim 10 wherein said hinged door comprises opposing sides, each side having an angled ramp.

14. The electronic device of claim 13 wherein each side also comprises a door catch.

15. The electronic device of claim 13 wherein each side also comprises a plurality of door catches.

\* \* \* \* \*

UNITED STATES PATENT AND TRADEMARK OFFICE
CERTIFICATE OF CORRECTION

PATENT NO. : 9,054,444 B2  
APPLICATION NO. : 14/125069  
DATED : June 9, 2015  
INVENTOR(S) : Mark D. Senatori Page 1 of 1

It is certified that error appears in the above-identified patent and that said Letters Patent is hereby corrected as shown below:

In the Claims

In column 6, line 9 approx., in Claim 11, delete "partially dosed" and insert -- partially closed --, therefor.

In column 6, line 9 approx., in Claim 11, delete "fully dosed" and insert -- fully closed --, therefor.

Signed and Sealed this
Eighth Day of December, 2015

Michelle K. Lee
*Director of the United States Patent and Trademark Office*